(12) United States Patent
Chuang et al.

(10) Patent No.: US 8,772,950 B2
(45) Date of Patent: Jul. 8, 2014

(54) METHODS AND APPARATUS FOR FLIP CHIP SUBSTRATE WITH GUARD RINGS OUTSIDE OF A DIE ATTACH REGION

(71) Applicant: Taiwan Semiconductor Manufacturing Company, Ltd., Hsin-Chu (TW)

(72) Inventors: Chita Chuang, Kaohsiung (TW);
Yao-Chun Chuang, Hsin-Chu (TW);
Chen-Cheng Kuo, Chu-Pei (TW);
Chen-Shien Chen, Zhubei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/671,284

(22) Filed: Nov. 7, 2012

(65) Prior Publication Data

US 2014/0124947 A1 May 8, 2014

(51) Int. Cl.
*H01L 29/74* (2006.01)
*H01L 31/111* (2006.01)

(52) U.S. Cl.
USPC ............ 257/774; 257/E27.112; 257/E23.021; 257/E21.597; 257/E21.585; 257/773; 257/127; 257/778; 257/737; 257/738; 257/700; 257/758; 257/683; 257/659; 257/620; 257/347

(58) Field of Classification Search
USPC .......... 257/778, 737, 738, 347, E27.112, 700, 257/774, 773, 620, 659, 683, 758, 750, 763, 257/622, E23.067, 77, 341, 76, E21.597, 257/E21.585; 438/462, 68, 113, 464, 460, 438/463
See application file for complete search history.

(56) References Cited

U.S. PATENT DOCUMENTS

| | | | | |
|---|---|---|---|---|
| 6,100,589 A * | 8/2000 | Tanaka | ........................... | 257/758 |
| 6,975,017 B2 * | 12/2005 | Towle et al. | ................... | 257/620 |
| 7,087,452 B2 * | 8/2006 | Joshi et al. | ........................ | 438/68 |
| 7,276,440 B2 * | 10/2007 | Zhang et al. | ................... | 438/629 |
| 7,535,062 B2 * | 5/2009 | Maki et al. | ..................... | 257/347 |
| 7,598,154 B2 * | 10/2009 | Izumi | ............................ | 438/462 |
| 7,791,308 B2 * | 9/2010 | Kitabatake et al. | ........... | 318/801 |
| 7,842,610 B2 * | 11/2010 | Uchiyama | ..................... | 438/667 |
| 2001/0043143 A1 * | 11/2001 | Dishongh et al. | ............. | 340/653 |
| 2004/0036179 A1 * | 2/2004 | Chiu et al. | ..................... | 257/778 |
| 2004/0099877 A1 * | 5/2004 | Towle et al. | ..................... | 257/127 |
| 2006/0125118 A1 * | 6/2006 | Yamazaki | ...................... | 257/784 |
| 2008/0001296 A1 * | 1/2008 | Tu et al. | ......................... | 257/762 |
| 2008/0128893 A1 * | 6/2008 | Uno | .............................. | 257/700 |
| 2012/0178260 A1 * | 7/2012 | Lin et al. | ........................ | 438/700 |
| 2012/0241917 A1 * | 9/2012 | Ide et al. | ........................ | 257/622 |

* cited by examiner

*Primary Examiner* — Alexander Oscar Williams
(74) *Attorney, Agent, or Firm* — Slater and Matsil, L.L.P.

(57) ABSTRACT

Methods and apparatus for flip chip substrates with guard rings. An embodiment comprises a substrate core with a die attach region for attaching an integrated circuit die; at least one dielectric layer overlying a die side surface of the substrate core; and at least one guard ring formed adjacent a corner of the substrate core, the at least one guard ring comprising: a first trace overlying the dielectric layer having rectangular portions extending in two directions from the corner of the substrate core and in parallel to the edges of the substrate core; a second trace underlying the dielectric layer; and at least one via extending through the dielectric layer and coupling the first and second traces; wherein the first trace, the at least one via, and the second trace form a vertical via stack. Methods for forming the flip chip substrates with the guard rings are disclosed.

20 Claims, 6 Drawing Sheets

METHODS AND APPARATUS FOR FLIP CHIP SUBSTRATE WITH GUARD RINGS OUTSIDE OF A DIE ATTACH REGION

TECHNICAL FIELD

The present disclosure relates generally to integrated circuit packaging where an integrated circuit die is mounted to a substrate, and more specifically to a flip-chip mounted integrated circuit die mounted to a substrate with guard rings to reduce stress.

BACKGROUND

Flip chip mounting of integrated circuit dies on substrates is increasingly used. Ball grid array (BGA) and stacked packages incorporate the use of an integrated circuit having conductive terminals, such as solder balls or solder bumps, formed on bond pads, that are mounted with the active surface facing a substrate that has conductive lands arranged corresponding to the conductive terminals. The integrated circuit die is mounted to the substrate by a solder reflow process, for example. Alternatives for the conductive terminals include copper studs, copper bumps, or solder or copper pillars or columns. An underfill material may be provided beneath the integrated circuit die and surrounding the conductive terminals to provide thermal stress relief to the integrated circuit die. However, thermal stress and mechanical stress have been observed between the die and the substrate, particularly in the corner regions. Conventional approaches to the stress include forming copper regions in the corners of the substrate outside of the die area; however die to substrate stress problems such as substrate cracking are still observed. As integrated circuit dies continue to increase in area and the number of terminals increases, the line spacing and line width of the conductor traces on the substrate are reduced, and integrated circuit die to substrate stress continues to increase.

BRIEF DESCRIPTION OF THE DRAWINGS

For a more complete understanding of the present disclosure, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION

The making and using of example illustrative embodiments are discussed in detail below. It should be appreciated, however, that the embodiments provide many applicable inventive concepts that can be embodied in a wide variety of specific contexts. The specific embodiments discussed are merely illustrative of specific ways to make and use the various embodiments, and do not limit the scope of the specification or the appended claims.

Figure 1:
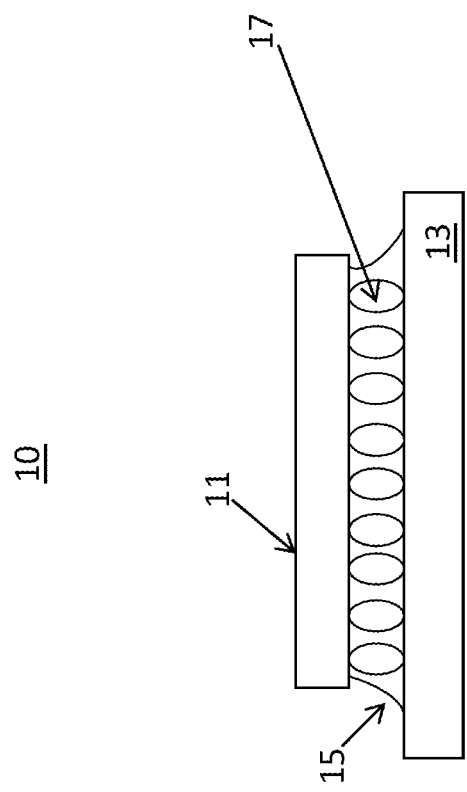
FIG. 1 illustrates, in a cross sectional view, a flip chip package for use with an embodiment.

FIG. 1 illustrates, in a simplified cross-sectional view, a package 10 that includes a flip chip integrated circuit 11 on a substrate 13 for use with the embodiments. Conductive terminals 17 are shown coupled to both the integrated circuit die 11 and the substrate 13, and an underfill layer 15 is shown between the integrated circuit die 11 and the substrate 13, and surrounding the conductive terminals 17.

In FIG. 1, the integrated circuit die 11 may be any integrated circuit and may be formed on a semiconductor substrate, or wafer, as one of many integrated circuits, which are then singulated or separated from each other after wafer processing is completed. The die 11 may be formed on silicon, germanium, gallium arsenide or other semiconductor material and may include many active and passive devices such as transistors. Conductive terminals 17 are mounted on bond pads (not visible) that are the electrical terminals of the integrated circuit 11 and are electrically coupled to the circuits of the integrated circuit 11. The conductive terminals 17 are, in one embodiment, solder balls formed of a eutectic material. The conductive terminals 17 are, in another embodiment, solder balls of a lead based solder material. As an alternative embodiment, the conductive terminals 17 may be lead-free solder material such as tin, silver, copper compounds (Sn—Ag—Cu, sometimes referred to as SAC) or other lead free materials. As an alternative, the conductive terminals 17 may be copper balls, copper studs, copper pillars and other materials, these form additional embodiments. C4 (controlled collapse chip connections) may be used as another alternative embodiment. Plating layers such as nickel, gold, palladium, platinum and the like and combinations of these may be formed over the conductive terminals to improve solderability and reduce corrosion and diffusion of materials.

The underfill 15 provides a thermal stress buffer to protect the conductive terminals 17 from cracking due to thermal stress during assembly, or during operation of the integrated circuit 11. As the materials of the substrate 13 differ from the materials of the integrated circuit, 11 a coefficient of thermal expansion (CTE) mismatch occurs. The underfill 15 compensates for the thermal stresses that occur due to the CTE mismatch. The underfill 15 may be resin, epoxy, or mold compound. The underfill material may be dispensed as a liquid material and flowed user die 11 using capillary action. The underfill may be provided in other forms as well. An underfill cure cycle such as a thermal or UV cure may be used to harden the underfill after the underfill is dispensed.

Substrate 13 is, in one embodiment, based on an insulating core such as a fiberglass reinforced resin core. One example core material is FR4. Alternatives for the core material include bismaleimide-triazine (BT) resin, or alternatively, other PC board materials or films. The substrate 13 also includes a redistribution layer of dielectric layers and conductors (not shown, but described below). In an embodiment, these layers are formed of organic build up layers and may include one or more conductor layers, typically of copper or copper alloys, that allow traces to be formed for redistribution of conductive signals horizontally. Conductive vias are formed and filled with conductor material to allow vertical connections between the multiple layers. The redistribution layers may be formed on both sides of the substrate 13. In one alternative embodiment, the substrate 13 has additional conductive terminals, such as solder balls (not shown), formed on the lower or system board surface to form a ball grid array (BGA) package. Additional details of the substrate 13 are explained below.

The flip chip package 10 is assembled by placing the integrated circuit die 11 and the conductive terminals 17 in alignment with conductive lands (not visible in FIG. 1) on substrate 13 and bringing the conductive terminals 17 and conductive lands into contact. In an embodiment, the conductive terminals are solder balls. In this embodiment, the solder balls implementing the conductive terminals are processed in a thermal reflow process, which causes them to melt and form a physical and electrical bond to the conductive lands on the substrate, physically attaching and electrically connecting the integrated circuit die 11 to the substrate 13. The underfill 15 is then applied to complete the assembly process.

Figure 2:
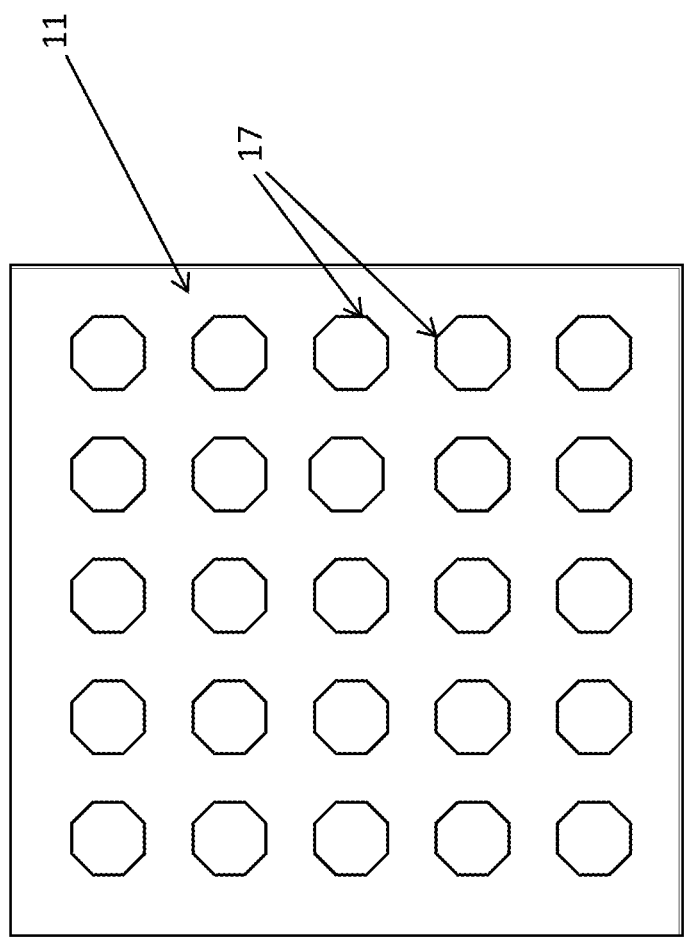
FIG. 2 illustrates, in a plan view, an integrated circuit for use with the embodiments.

FIG. 2 depicts, in a plan view, a portion of the active surface of integrated circuit 11 with an array of conductive terminals 17, which in this example embodiment are shown as solder balls. In this example embodiment, the conductive terminals are formed in columns and rows, and while the example of FIG. 2 depicts a 5×5 (25 terminals) arrangement, many integrated circuit dies currently being produced have hundreds of the conductive terminals. As circuit integration continues to increase, the area of the integrated circuit dies is increasing, and the number of conductive terminals, such as the example solder balls, (which are the signal or connection terminals for the integrated circuit 11) is also increasing. The substrates that receive the integrated circuit are therefore also being formed with an increasing number of conductive lands and signal traces, the traces are provided with ever smaller widths and reduced spacing. These factors are increasing the stress that results between the die and the substrate in flip chip packages.

Figure 3:
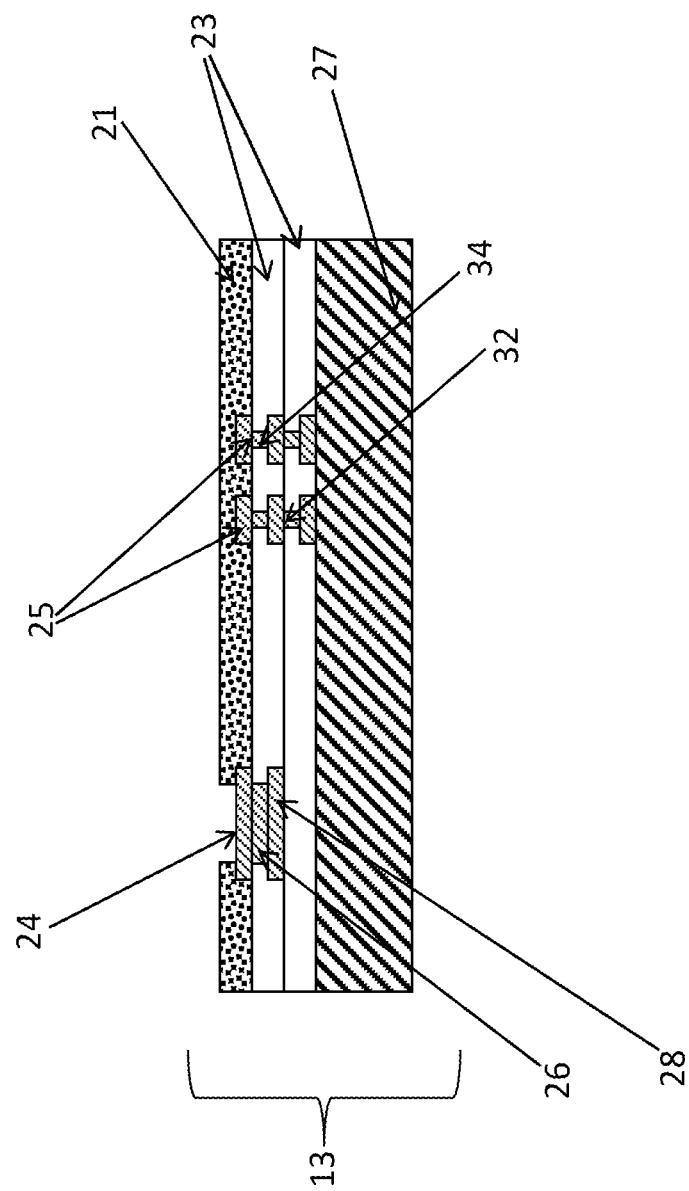
FIG. 3 illustrates, in a cross-sectional view, an example illustrative embodiment.

FIG. 3 shows in a simplified cross-section a corner portion of an embodiment substrate 13. In FIG. 3, a core 27 is shown with two layers of build up material 23 over the die side surface. A solder mask layer 21 covers the die side surface of core 27. A conductive land 24 is shown with an opening in the solder mask 21. Conductive land 24 is formed to receive a conductive terminal in an example embodiment; conductive land 24 receives a solder ball when the integrated circuit die (described below) is mounted to the substrate. The conductive land 24 is typically a copper or copper alloy material. As alternatives, gold, aluminum, and other conductors could be used. A plating finish such as nickel, electroless nickel immersion gold (ENIG), electroless nickel electroless palladium immersion gold (ENEPIG), palladium and the like could be formed on land 24 to increase solderability and reduce corrosion. Conductive land 24 is coupled by a via 26 to another metal trace 28 formed within the build up layers 23. In this manner, the signals may be redistributed horizontally and vertically in the build up layers 23

The build up layers 23 are, in one embodiment, formed of additive laminate layers of a dielectric material. In one embodiment, Ajinomoto build-up film (ABF) is used. The build up layers 23 are each formed over a copper trace pattern, the copper may be formed by electroplating, for example. The copper is then patterned by photolithography and etch processes to form traces. Vias such as via 26 may be formed by opening a via opening in the build up layers 23 using a laser or etch process, and then filling the vias 26 with conductive plugs for example.

In FIG. 3, two guard rings 25 are shown. The guard rings are placed near the edge of the substrate 13 and outside of the area of the substrate that will be covered by the die (not shown). As is described below, the guard rings 25 provide mechanical support and reduce cracking in the substrate near the die area due to die to substrate stresses. In the example shown in FIG. 3, two guard rings 25 are shown, each having two via stacks-a first via layer 34 and a second via layer 32 is shown. The guard rings 25 include traces formed at each layer of the redistribution layer formed by the core and the build up layers 23. However, in alternative embodiments, a single guard ring 25 may be used. In other alternative embodiments, multiple guard rings including 2, 3, 4 or more, may surround the corners of the die area. Further, the guard rings may have via stacks extending only one level down, a one via stack, in the build up layers 23. As shown in FIG. 3, there may be two via stacks 32 and 34 under the guard rings 25. In still other alternative embodiments, if additional build up layers 23 are used, additional via stacks may be formed and additional trace layers are formed as part of guard rings 25.

The guard rings 25 are not electrically connected to the die and so there are no lands shown for guard rings 25. In an embodiment, the guard rings 25 are tied to an isolated ground signal, to prevent noise or unwanted capacitive coupling to switching signals.

Figure 4:
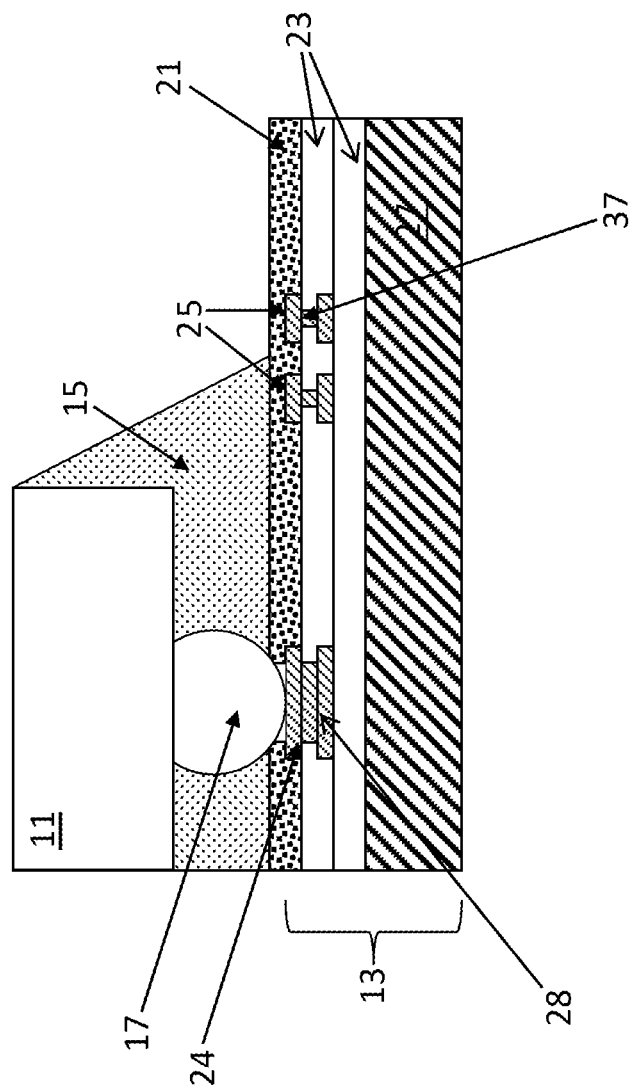
FIG. 4 illustrates, in a cross-sectional view, a portion of another illustrative embodiment.

With reference now to FIG. 4, there is shown in a cross sectional view a corner portion of the substrate 13 with integrated circuit die 11 mounted to the substrate 13. A conductive terminal 17 is shown disposed on the conductive land 24. In the illustrated embodiment the conductive terminal 17 is a solder ball. The build up layers 23 are shown over the die side surface of core 27. The guard rings 25 are shown in the build up layers 23 and covered by the solder mask layer 21. In this example embodiment, the guard rings 25 show only a single via stack 37. Underfill 15 is disposed between the integrated circuit die 11 and the substrate 13. The underfill 15, in this example embodiment, covers the innermost one of the guard rings 25, but not the other one. In alternative embodiments, the underfill 15 may cover both guard rings 25, while in other embodiments that are additional alternatives, the underfill may not cover either guard ring 25.

The guard rings may be formed of the same material as the conductive traces such as 28 in the build up layers 23 of the substrate 13. In embodiments, the guard rings 25 are of copper or copper alloys. The guard rings 25 may be formed in the same manner as the traces of the substrate 13 that is, by electroplating and patterning the copper material to form traces, and laminating the ABF material over the traces, then opening vias by laser hole patterning or by another etch process in the ABF material of build up layers 23. The vias such as 37 are filled with conductor material, and the process continues for each layer desired in the guard ring structure. The guard rings 25 are formed at the same time as, in the same manner as, the conductive traces formed in the build up layers 23, for example.

Figure 5:
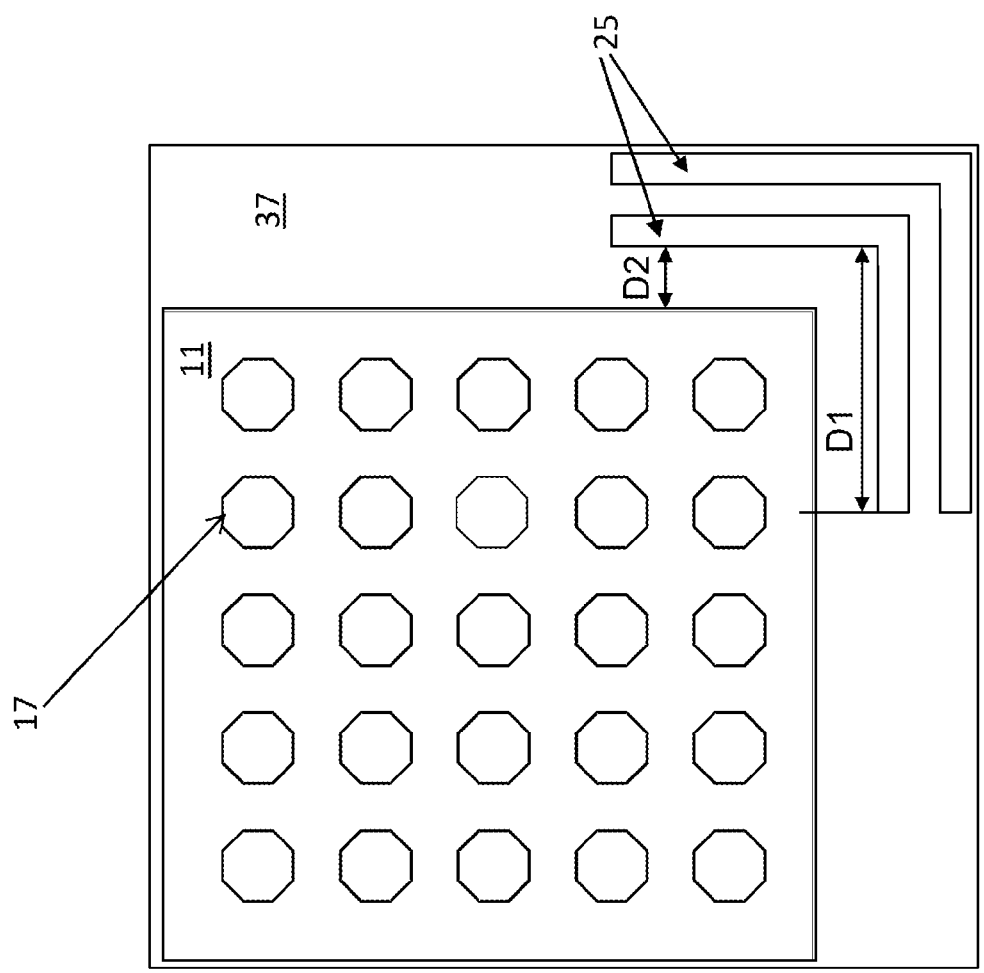
FIG. 5 illustrates, in a plan view, the embodiment illustrated in FIG. 4.

FIG. 5 depicts in a plan view a corner portion of a substrate 37 illustrating an example embodiment. In FIG. 5, an integrated circuit die 11 is shown with a plurality of conductive terminals 17 arranged in a matrix of rows and columns, as in FIG. 2; the integrated circuit die is mounted on the substrate 37 as in FIG. 1 above. Guard rings 25 are shown arranged at a corner portion of the substrate 37 (in an embodiment there are guard rings 25 at each corner of the substrate, although only one corner is depicted here). The inner most guard ring is spaced from the edge of the integrated circuit die 11 by a spacing distance D2. This spacing distance may be from 0.1 millimeters up to 0.8 millimeters, for example, or more. In one embodiment, the spacing distance D2 is greater than about 0.1 millimeters. The length of each side of the guard rings 25 may be varied. In order to provide routing flexibility for the traces in the build up layers, the guard rings 25 do not enclose or encircle the integrated circuit die 11. Instead, a portion of the guard rings 25 runs parallel to each side of the substrate at each corner for a distance, and then ends. This feature allows the use of routing of signal traces to the edge of the substrate 37, for example. In an embodiment, the distance D1, the length of the guard ring, is less than the distance from the edge of the guard ring to two conductive terminals (such as the example solder balls) on the integrated circuit die 11. If the trace routing needed for a particular substrate in an application allows, the distance D1 may be greater. A tradeoff between the area of the guard rings 25 and the signal trace area is made. In addition, the number of vias in the via stacks in the guard rings may be one, or more, via stacks. The number of guard rings 25 may be as little as one, in an embodiment, two, as shown in the example embodiments herein, or three or more guard rings, these form additional embodiments. The guard rings may have various widths in a range from 0.03 mm-1.0 mm for example. The spacing between the guard rings may also vary but in example embodiments, the spacing is between 0.01 mm to 1.5 mm. The width of the guard rings in example embodiments may range from 30 microns to 1.0 millimeters, for example.

Figure 6:
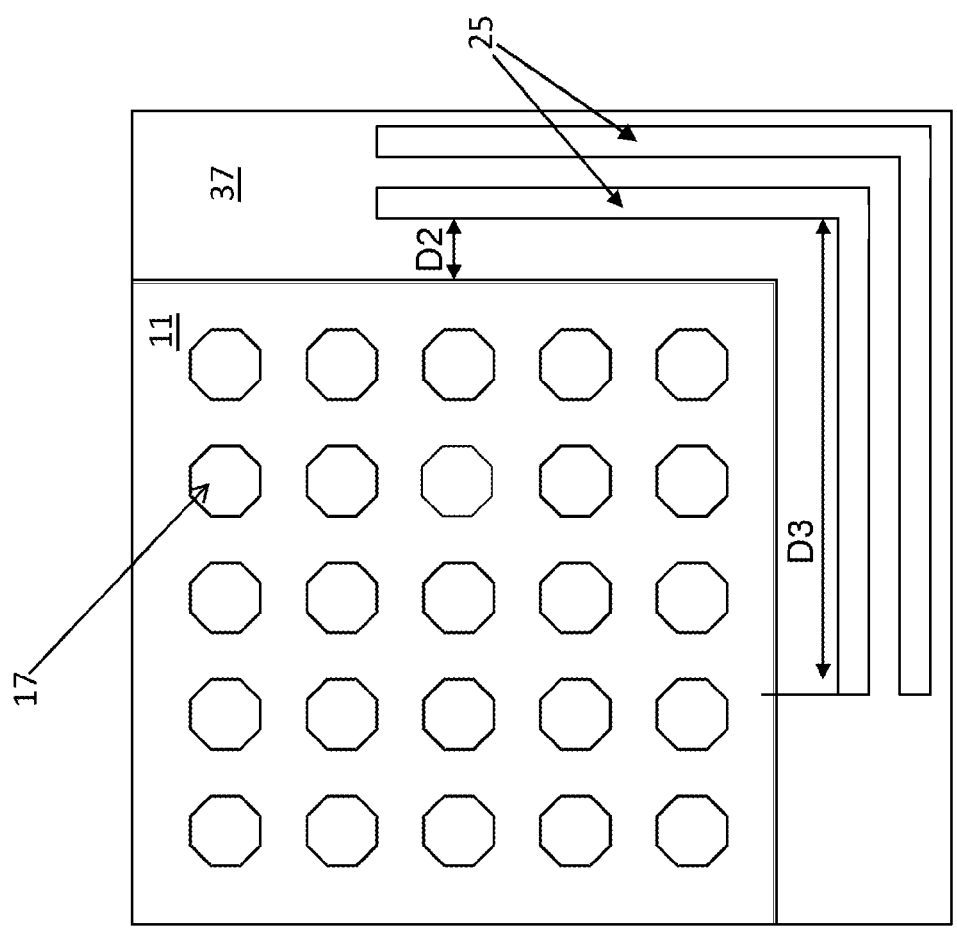
FIG. 6 illustrates, in a plan view, an alternative embodiment.

FIG. 6 depicts in a plan view a corner portion of substrate 37 using an alternative embodiment of the guard rings 25. In FIG. 6, a substrate 37 is shown and again, an integrated circuit 11 is provided with conductive terminals 17 mounted to the substrate as in FIG. 5. The conductive terminals 17 are shown, in this example embodiment, as solder balls. In the example embodiment illustrated in FIG. 6, the guard rings have a length in each direction that is greater than the sum of the pitch of three solder balls on integrated circuit 11. In this embodiment, the guard rings 25 extend farther from each corner of the substrate 37 and the routing of the signals is therefore more limited, however, in some applications the routing of the signals on the substrate may not require as much area, and so in those applications, the guard rings 25 may be extended.

Use of the embodiment substrates with guard rings provides stress relief for stress that occurs between the edge of the integrated circuit and the substrate in the most critical areas, the corners. Use of the embodiments also reduces the stress problems observed, such as substrate cracking, in those areas. The guard rings are formed using the same materials already in use in the substrate and conductor traces, so that no additional processing steps are needed. The guard rings are formed in the corners and the adjacent areas, leaving the middle portions of each side of the substrate for signal trace routing. The use of the embodiments provides substrates for flip chip packages with additional process window tolerance, increasing yield and reducing costs.

In an embodiment, an apparatus is disclosed including a substrate core with a die attach region for attaching an integrated circuit die on a die side surface, and regions outside of the die attach region including the corners of the substrate, the die attach region including conductive lands for attaching the conductive terminals of the integrated circuit die; at least one dielectric layer overlying the substrate core; and at least one guard ring formed adjacent a corner of the substrate core and in the region outside of the die attach region, the at least one guard ring including a first trace overlying the dielectric layer having rectangular portions extending in two directions from the corner of the substrate core and in parallel to the edges of the substrate core; a second trace underlying the dielectric layer and formed in correspondence to the first trace; and at least one via extending through the dielectric layer and coupling the first and second traces; wherein the first trace, the at least one via, and the second trace form a vertical via stack.

In a further embodiment, in the above apparatus, the innermost portion of the at least one guard ring is spaced from the die attach region by a distance of at least 0.1 mm. In another embodiment, in the above apparatus, the innermost portion of the at least one guard ring is spaced from the die attach region by a distance of between 0.1 mm and 0.8 mm.

In additional embodiments, the above apparatus further includes a second guard ring formed on the substrate core at a least one corner, and formed in a region outside of the at least one guard ring. In still further embodiments, the above apparatus includes a second dielectric layer over the die side surface of the substrate core, underlying the at least one dielectric layer. In still further embodiments, in the above apparatus, the at least one guard ring further includes a second via extending through the second dielectric layer, and a third trace underlying the second dielectric layer and arranged in correspondence with the first trace, wherein the at least one guard ring forms a two via stack including the first trace, the at least one via, the second trace, the second via, and the third trace. In still further embodiments, the at least one guard ring extends from the corner of the core substrate in parallel, to the edge of the substrate a distance that is less than the distance that would be needed to pass two conductive lands in the die attach region.

In yet another embodiment, in the above apparatus, the at least one guard ring extends from the corner of the core substrate in parallel to the edge of the substrate, a distance that is greater than the distance that would be needed to pass three conductive lands in the die attach region. In another embodiment, in the above apparatus, the at least one dielectric layer comprises an organic build up layer. In a further embodiment, in the above apparatus, the core substrate further comprises a fiberglass reinforced resin. In still another embodiment, in the above apparatus, the first and second traces of the at least one guard ring comprise copper or copper alloy.

In an alternative embodiment, an apparatus includes a substrate core with a die attach region for attaching an integrated circuit die on a die side surface, and regions outside of the die attach region including the corners of the substrate core, the die attach region including lands for attaching the conductive terminals of the integrated circuit die; an integrated circuit having conductive terminals attached to the die attach region of the substrate core in a flip chip arrangement, the conductive terminals positioned on corresponding lands; at least one guard ring formed adjacent a corner of the substrate core and in the region outside of the die attach region, the at least one guard ring comprising: a first trace overlying a dielectric layer having rectangular portions extending in two directions from the corner of the substrate core and each rectangular portion arranged in parallel to the edges of the substrate core; a second trace underlying the dielectric layer and formed in correspondence to the first trace; and at least one via extending through the dielectric layer and coupling the first and second traces; wherein the first trace, the at least one via, and the second trace form a vertical via stack.

In still another embodiment, the above apparatus further includes a second guard ring formed on the substrate core at a least one corner, and formed in a region outside of the at least one guard ring. In still another embodiment, the above apparatus further includes a second dielectric layer over the die side surface of the substrate core, underlying the at least one dielectric layer, wherein the at least one guard ring further comprises a second via extending through the second dielectric layer, and a third trace underlying the second dielectric layer and arranged in correspondence with the first trace, wherein the at least one guard ring forms a two via stack including the first trace, the at least one via, the second trace, the second via, and the third trace. In yet another embodiment, in the above apparatus, the at least one guard ring extends from the corner of the core substrate in parallel to the edge of the substrate a distance that is less than the distance that would be needed to pass two conductive terminals on the integrated circuit. In still a further embodiment, the at least one guard ring extends from the corner of the core substrate in parallel to the edge of the substrate a distance that is greater than the distance that would be needed to pass three conductive terminals on the integrated circuit.

In another embodiment, a method includes providing a substrate core having a die attach region on a die side surface for receiving an integrated circuit, and regions outside the die attach region, including the corners of the substrate; forming at least one dielectric layer over the substrate core; forming at least one guard ring in at least one corner of the substrate core outside of the die attach region by forming a first trace over a die side surface of the substrate core, a first via extending through the at least one dielectric layer, a second trace underlying the at least one dielectric layer, the first trace, the first via and the second trace forming a vertical stack; wherein the guard ring forms a rectangular shape that extends in two directions from the corner of the substrate core and is formed in parallel to the edges of the substrate core.

In another embodiment, in the above method, the method includes forming a second dielectric layer between the substrate core and the first dielectric layer; wherein forming the at least one guard ring further comprises forming a third trace underlying the second dielectric layer, and forming a second via extending through the second dielectric layer, and the guard ring forms a vertical stack that includes the first trace, the first via, the second trace, the second via, and the third trace.

In a further embodiment, the above includes forming a second guard ring in the at least one corner of the core substrate outside of the at least one guard ring. In still another embodiment, in the above method, the spacing between the innermost portion of the at least one guard ring and an outside edge of the integrated circuit is at least 0.1 millimeters.

Although the example embodiments have been described in detail, it should be understood that various changes, substitutions and alterations can be made herein without departing from the spirit and scope of the application as defined by the appended claims. For example, different materials may be utilized for the conductors, the guard rings, the conductive terminals, the build up layers or different methods of formation may be utilized for the various layers of material. These devices, steps and materials, may be varied while remaining within the scope of the appended claims.

Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the embodiments and alternative embodiments. Accordingly, the appended claims are intended to include within their scope such processes, machines, manufacture, compositions of matter, means, methods or steps.

What is claimed is:

1. An apparatus, comprising:
    a substrate core with a die attach region for attaching an integrated circuit die to the substrate core on a die side surface, and regions outside of the die attach region including corners of the substrate core, the die attach region including all portions of the substrate core laterally covered by the integrated circuit die in a plan view and including conductive lands for attaching conductive terminals of the integrated circuit die;
    at least one dielectric layer overlying the substrate core; and
    at least one guard ring formed adjacent a corner of the substrate core and in the region outside of the die attach region in a plan view, the at least one guard ring comprising:
        a first trace overlying the dielectric layer having rectangular portions extending in two directions from the corner of the substrate core and in parallel to external edges of the substrate core;
        a second trace underlying the dielectric layer and formed in correspondence to the first trace; and
        at least one via extending through the dielectric layer and coupling the first trace and the second trace;
    wherein the first trace, the at least one via, and the second trace form a one via stack.

2. The apparatus of claim 1, wherein an innermost portion of the at least one guard ring is spaced from the die attach region by a distance of at least 0.1 mm.

3. The apparatus of claim 1, wherein the wherein an innermost portion of the at least one guard ring is spaced from the die attach region by a distance of between 0.1 mm and 0.8 mm.

4. The apparatus of claim 1, and further comprising a second guard ring formed on the substrate core in a region outside of the at least one guard ring.

5. The apparatus of claim 1, and further comprising:
    a second dielectric layer over the die side surface of the substrate core, underlying the at least one dielectric layer.

6. The apparatus of claim 5, wherein the at least one guard ring further comprises:
    a second via extending through the second dielectric layer, and a third trace underlying the second dielectric layer and arranged in correspondence with the first trace, wherein the at least one guard ring forms a two via stack including the first trace, the at least one via, the second trace, the second via, and the third trace.

7. The apparatus of claim 1, wherein the at least one guard ring extends from the corner of the substrate core in parallel to an edge of the substrate core a distance that is less than the distance that would be needed to pass at least two conductive lands in the die attach region.

8. The apparatus of claim 1, wherein the at least one guard ring extends from the corner of the substrate core in parallel to an edge of the substrate core a distance that is greater than the distance that would be needed to pass at least three conductive lands in the die attach region.

9. The apparatus of claim 1, wherein the at least one dielectric layer comprises an organic build up layer.

10. The apparatus of claim 1, wherein the substrate core further comprises a fiberglass reinforced resin.

11. The apparatus of claim 1, wherein the first trace and the second trace of the at least one guard ring comprise copper or copper alloy.

12. An apparatus, comprising:
    a substrate core with a die attach region on a die side surface, and regions outside of the die attach region including corners of the substrate core, the die attach region including conductive lands;

an integrated circuit die having conductive terminals attached to the die attach region of the substrate core in a flip chip arrangement, the conductive terminals positioned on corresponding conductive lands; and at least one guard ring formed adjacent a corner of the substrate core and in the region outside of the die attach region, the at least one guard ring comprising:
  a first trace overlying a first dielectric layer having rectangular portions extending in two directions from the corner of the substrate core, each rectangular portion arranged in parallel to edges of the substrate core;
  a second trace underlying the dielectric layer and formed in correspondence to the first trace; and
  at least one via extending through the first dielectric layer and coupling the first trace and the second trace;
wherein the first trace, the at least one via, and the second trace form a one via stack.

13. The apparatus of claim 12, and further comprising a second guard ring formed on the substrate core in a region outside of the at least one guard ring.

14. The apparatus of claim 12, and further comprising a second dielectric layer over the die side surface of the substrate core, underlying the first dielectric layer, wherein the at least one guard ring further comprises a second via extending through the second dielectric layer, and a third trace underlying the second dielectric layer and arranged in correspondence with the first trace, wherein the at least one guard ring forms a two via stack including the first trace, the at least one via, the second trace, the second via, and the third trace.

15. The apparatus of claim 12, wherein the at least one guard ring extends from the corner of the substrate core in parallel to an external edge of the substrate core a distance that is less than the distance that would be needed to pass no more than conductive terminals on the integrated circuit.

16. The apparatus of claim 12, wherein the at least one guard ring extends from the corner of the substrate core in parallel to an external edge of the substrate core a distance that is greater than the distance that would be needed to pass at least three conductive terminals on the integrated circuit.

17. A method, comprising:
  providing a substrate core having a die attach region on a die side surface for receiving an integrated circuit, and regions outside the die attach region including corners of the substrate core;
  forming at least one dielectric layer over the substrate core; and
  forming at least one guard ring in at least one corner of the substrate core outside of the die attach region by forming a first trace over a die side surface of the substrate core, a first via extending through the at least one dielectric layer, a second trace underlying the at least one dielectric layer so that the first trace, the first via and the second trace form a one via stack;
  wherein the guard ring forms rectangular portions that extend in two directions from the at least one corner of the substrate core and each rectangular portion is formed in parallel to edges of the substrate core.

18. The method of claim 17, and further comprising:
  forming a second dielectric layer between die side surface of the substrate core and the at least one dielectric layer;
  wherein forming the at least one guard ring further comprises forming a third trace underlying the second dielectric layer, and forming a second via extending through the second dielectric layer, and the guard ring forms a two via stack that includes the first trace, the first via, the second trace, the second via, and the third trace.

19. The method of claim 17, and further comprising:
  forming a second guard ring in the at least one corner of the substrate core outside of the at least one guard ring.

20. The method of claim 17, wherein a spacing between an innermost portion of the at least one guard ring and an outside edge of the integrated circuit is at least 0.1 millimeters.

* * * * *